(12) United States Patent
Liu et al.

(10) Patent No.: US 9,641,368 B2
(45) Date of Patent: May 2, 2017

(54) SYSTEM FOR DIRECT CONVERSION RECEIVERS

(71) Applicant: Stichting IMEC Nederland, Eindhoven (NL)

(72) Inventors: Yao-Hong Liu, Sinjhuang (TW);
Wilhelmus Matthias Clemens Dolmans, Son en Breugel (NL);
Johannes Henricus Cornelus van den Heuvel, Geldrop (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 0 days.

(21) Appl. No.: 14/612,616

(22) Filed: Feb. 3, 2015

(65) Prior Publication Data
US 2015/0222464 A1 Aug. 6, 2015

(30) Foreign Application Priority Data

Feb. 6, 2014 (EP) ..................................... 14154150
Jul. 29, 2014 (EP) ..................................... 14178858

(51) Int. Cl.
*H03D 3/24* (2006.01)
*H04L 27/22* (2006.01)
*H04L 27/152* (2006.01)
*H04L 27/148* (2006.01)
*H03J 1/00* (2006.01)
(Continued)

(52) U.S. Cl.
CPC .............. *H04L 27/22* (2013.01); *H03J 1/005* (2013.01); *H04L 27/148* (2013.01); *H04L 27/152* (2013.01); *H04B 1/0028* (2013.01); *H04B 1/30* (2013.01)

(58) Field of Classification Search
CPC ..... H03L 7/091; H03L 2207/50; H03L 7/099; H04B 2001/0491; H04B 1/30; H04B 1/04; H04B 15/02; H04B 15/04
USPC .................. 375/327; 455/118, 260, 76, 324; 327/156
See application file for complete search history.

(56) References Cited

U.S. PATENT DOCUMENTS

| 5,321,852 A * | 6/1994 | Seong ........................ 455/182.1 |
| 8,144,046 B2 | 3/2012 | Matsumoto |
| 2003/0176174 A1 * | 9/2003 | Seppinen et al. .......... 455/226.1 |

(Continued)

OTHER PUBLICATIONS

Li, Bo et al., "Ultra low power phase detector and phase-locked loop designs and their application as a receiver," Microelectronics Journal, vol. 42, Issue 2, pp. 358-364, Feb. 2011.

*Primary Examiner* — Leila Malek
(74) *Attorney, Agent, or Firm* — McDonnell Boehnen Hulbert (57) ABSTRACT

The present disclosure relates to a front-end system for a radio device. In one example, a front-end system comprises a converter, the converter comprising a mixer configured for down-converting a radio frequency signal into a baseband signal by using a local oscillator signal generated by a signal generator, and characterized in that, the converter further comprises a quantizer arranged for quantizing the baseband signal into a digital signal. Further, the signal generator may be configured for generating, based on the digital signal, the local oscillator signal such that it is synchronized with the radio frequency signal.

19 Claims, 9 Drawing Sheets

(51) Int. Cl.
  *H04B 1/00* (2006.01)
  *H04B 1/30* (2006.01)

(56) References Cited

U.S. PATENT DOCUMENTS

| | | |
|---|---|---|
| 2003/0203727 A1* | 10/2003 | Kluge et al. ............... 455/234.1 |
| 2008/0238625 A1* | 10/2008 | Rofougaran et al. ........ 340/10.1 |
| 2009/0312056 A1* | 12/2009 | Drugge ............... H04L 27/0014 455/561 |
| 2010/0112940 A1* | 5/2010 | Yoon ........................ H04B 5/00 455/41.1 |
| 2012/0063519 A1 | 3/2012 | Oliaei |
| 2013/0148610 A1* | 6/2013 | Berggren et al. ............. 370/329 |
| 2013/0343754 A1* | 12/2013 | Shellhammer et al. ........ 398/43 |
| 2014/0273828 A1* | 9/2014 | Yang et al. .................. 455/41.1 |

* cited by examiner

SYSTEM FOR DIRECT CONVERSION RECEIVERS

CROSS-REFERENCE TO RELATED APPLICATIONS

This application claims priority to European Patent Application Serial No. 14154150.8 filed Feb. 6, 2014 and European Patent Application Serial No. 14178858.8 filed Jul. 29, 2014, the contents of each of which are hereby incorporated by reference in their entirety.

FIELD OF THE INVENTION

The present disclosure relates generally to wireless receivers, and more specifically, to direct conversion receivers utilizing phase or frequency demodulation, suitable for CMOS technology scaling and being operable at low supply voltages.

BACKGROUND

Realization of ultra-low power wireless receivers is one of the key challenges in low power wireless sensor network (WSN) and wireless body area network (WBAN) applications (e.g., wireless standards IEEE 802.15.4 (ZigBee) or Bluetooth Smart) as they usually dominate the overall power consumption of the remote radio or sensor nodes. In such applications, there may be only limited energy resources available. However, it is often useful to maintain long or unlimited operation time for radio nodes. As such, low power consumption of radio receivers becomes an important requirement for their design.

Conventional quadrature receiver architecture is popular for its good sensitivity and selectivity performances. An example of this type of receivers is a direct-conversion zero-IF receiver. In such architecture, the radio frequency (RF) signal is demodulated in the complex domain, resulting in a real part (I) and an imaginary part (Q) baseband signals. Although this architecture is widely used in the wireless applications, it has a high power consumption as it requires two independent RF-to-analogue signal processing circuits (commonly referred to as processing paths) for the separate demodulation of the I and Q signals, each of them including a mixer, a low-pass filter (LPF), an ADC and local oscillator (LO) buffers. Furthermore, the mismatch between I and Q signal paths (e.g., gain and delay mismatches of the low-pass filters or the programmable gain amplifier) degrades dramatically the demodulation quality. These architectures are also sensitive to presence of a DC offset voltage in the analogue baseband as it can easily saturate the ADC after amplification by the gain amplifier. Therefore, a DC offset cancellation mechanism, either AC-coupling or servo-loop, may be used in the quadrature receiver. Additionally, as the quadrature receiver operates in voltage domain, operating at low supply voltages becomes an issue, especially at the end of the analogue baseband path (i.e. at the ADC stage where the conversion of analogue voltage into digital code occurs), as lowering the supply voltage causes significant degradation of the ADC's dynamic range and hence of the dynamic range of the receiver itself.

Another disadvantage of the conventional architectures is that their overall performance is highly dependent on the performance of its analogue circuitry which degrades with CMOS technology scaling. The analogue performances of the deep-submicron CMOS devices, for example, output impedance, linearity, bandwidth, etc. are degraded significantly while the digital performances are improved.

In the paper "Ultra low power phase detector and phase-locked loop designs and their application as a receiver" (Li et al., Microelectronic Journal, vol. 42, pp. 358-364, 2011) a single path direct-conversion zero-IF receiver is described. Here, the RF signal is directly demodulated to baseband frequency (zero-frequency) by a phase-locked loop.

SUMMARY

The present disclosure aims at providing a power efficient wireless receiver utilizing phase or frequency demodulation, suitable for CMOS technology scaling and being operable at low supply voltages.

In some exemplary embodiments, the present disclosure relates to a front-end system for a radio device comprising a converter, the converter comprising a mixer configured for down-converting a radio frequency RF signal into a baseband BB signal by using a local oscillator LO signal generated by a signal generator, and characterized in that, the converter further comprises a quantizer arranged for quantizing the baseband signal into a digital signal DS, and wherein the signal generator is configured for generating, based on the digital signal, the local oscillator signal such that the local oscillator LO signal is synchronized with the radio frequency RF signal.

Advantageously, the proposed front-end system does not require a high-resolution quantizer or a high-precision threshold circuit for quantizing the baseband signal, since only the phase of the baseband signal is important.

In exemplary embodiments, the signal generator comprises a phase-looked loop PLL arranged for generating a plurality of signals each having a different phase. The signal generator may further comprise a selector arranged for selecting, based on the digital signal DS, a signal from the plurality of signals and for providing the selected signal to the mixer. The selected signal is selected such that the difference in frequency or phase between the selected signal and the radio frequency RF signal is minimized. In other words, the local oscillator signal is selected such that the phase difference between RF and LO is minimal. In one embodiment, the selector may be implemented as a multiplexer. Advantageously, the phase-looked loop is characterized with a defined carrier frequency. As a result, the front-end system is able to track the desired signal even in presence of strong interferences.

In other exemplary embodiments, the front-end system for a radio device may further comprise an accumulator arranged for accumulating the digital signal DS before being used as input for the selector.

In some other exemplary embodiments, the phase-looked loop may comprise a phase generator arranged for generating a plurality of phase shifts and adding the plurality of phase shifts to a reference signal, thereby generating the plurality of signals each having a different phase. The phase generator may be further arranged for providing the plurality of signals to the selector. The phase generator may be a time-to-digital converter.

In further exemplary embodiments, the digital signal DS may be representative of a frequency or of the phase of the radio frequency RF signal.

In yet further exemplary embodiments, the front-end system is suitable for performing any constant-envelope modulation schemes, i.e. PSK and FSK, and low peak-to-average ratio (PAR) non-constant envelope modulations.

In another embodiment, the front-end system comprises a filter arranged for filtering the digital signal before the signal generator. Advantageously, this allows further improvement of the interference rejection at 2 MHz and 3 MHz of the proposed front-end system.

In another embodiment, the front-end system comprises a carrier frequency offset compensation (CFO) module. Advantageously, using the CFO compensation module allows the proposed front-end system to correct for initial CFO and to cope with CFO drifts during data reception and in turn assure correct date reception.

In another exemplary embodiment, the present disclosure relates to a radio device comprising a front-end system as in the present disclosure.

In yet another exemplary embodiment the present disclosure relates to a communication network comprising a radio device as in the present disclosure.

BRIEF DESCRIPTION OF THE FIGURES

For a better understanding of the present disclosure, some exemplary embodiments are described below in conjunction with the appended figures and figures description, wherein.

DETAILED DESCRIPTION

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

In many short-range low power wireless applications (e.g., HS-OQPSK in ZigBee or GFSK in Bluetooth Low Energy), constant-envelope phase or frequency modulations, for example phase shift keying (PSK) or frequency shift keying (FSK), are typically employed for their relaxed linearity requirement on the front-end circuit. In such modulations, the amplitude information A(t) of the RF signal is kept constant and only its phase $\phi(t)$ or frequency f(t) information is modulated according to the baseband information (or the data to be transmitted). The baseband information is held in the phase or frequency of the RF signal.

In comparison with a conventional quadrature receiver requiring at least two front-end RF circuits for the processing of the in-phase (I) and quadrature (Q) demodulated signals separately, for a phase or frequency modulated radio architecture only one front-end circuit is required as only the phase or the frequency information is extracted. This is explained briefly below.

A complex I+jQ signal can be represented in a polar form with its time-variant magnitude A(t) and phase $\phi(t)$ information as follows:

$$A(t) = \sqrt{I^2(t) + Q^2(t)} \qquad (1)$$
$$\phi(t) = \tan^{-1}\left(\frac{Q(t)}{I(t)}\right).$$

Obviously, a phase modulated radio receiver architecture employing a phase demodulator as a mixer to directly extract the phase information requires only one front-end circuit for processing the extracted baseband information. Thus, the power consumption of such receiver is significantly reduced, as the receiver and LO generator hardware can be significantly simplified—the receiver may only need one mixer, one LO buffer, and one quantizer. In addition, as there is only one processing path (no I and Q paths), there is no matching requirement between I and Q paths.

Figure 1:
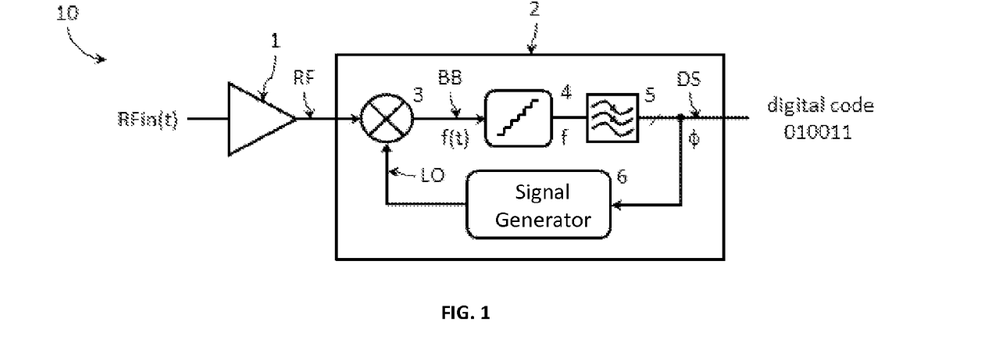
FIG. 1 illustrates, according to one exemplary embodiment, a front-end system of a radio device.

In one embodiment, the present disclosure relates to a front-end system 10 for a radio device, as shown in FIG. 1, comprising a converter 2 for converting the received radio frequency RF signal (being an I+jQ complex signal) directly to a digital signal DS. Such a front-end system may be referred to as a direct conversion system, as it directly converts the RF signal to a baseband BB signal. Herein, with "directly" is meant that, depending on the modulation scheme, the phase or frequency information of RF signal is directly extracted as a baseband signal. The front-end system 10 receives via an antenna (not shown in the figure) a radio frequency RF signal, RFin(t), which may be a phase-modulated or a frequency-modulated. The RF signal is then converted directly to a digital signal DS by the converter 2. Optionally, before conversion the received RF signal may be amplified by a low-noise (LNA) amplifier 1.

The converter 2 comprises a mixer 3, a signal generator 6 and a quantizer 4. The mixer 3 down-converts the incoming modulated RF signal to a baseband BB signal, by multiplying it with a local oscillator LO signal generated by the signal generator 6, thus extracting the baseband information. Depending on the modulation scheme, e.g., PSK or FSK, the mixer essentially operates as a phase or frequency detector to extract the phase information φ(t) or frequency information f(t) of the RF signal directly into a baseband signal BB. The extracted BB signal, thus represents the difference in phase or frequency of the LO signal with respect to the RF signal.

The present disclosure will be further explained in more details with respect to PSK modulated signals. However, it should be noted, the skilled person in the art will recognize that the present disclosure can be readily applied to any constant-envelope modulation schemes, i.e. PSK and FSK, and low peak-to-average ratio (PAR) non-constant envelope modulations.

Figure 3:
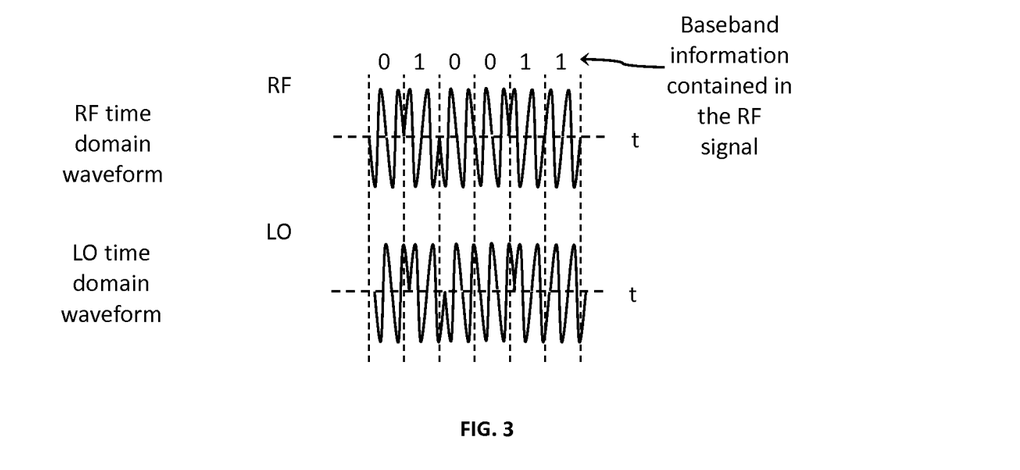
FIG. 3 illustrates an example of a local oscillator LO signal not synchronized with a radio frequency RF signal.

The down-conversion process will be now explained with references to FIG. 3 showing an example of an RF signal modulated with PSK modulation, where a 0° phase of the signal corresponds to a '0' binary information and a 180° phase to a '1' binary information. As it is shown in the figure, the frequency of both RF and LO signals is the same but LO signal is slightly delayed, which means the phase of the LO signal is slightly different than the phase of the RF signal, showing clearly that the two signals are not synchronized. This can be also represented in phase domain. The RF phase φ(t) is changing between +π and −π. As the LO signal is slightly delayed with respect to the RF signal its phase φ(t) is changing between π−Δφ and −π+Δφ. The mixer multiplies the RF and LO signals to extract the BB signal. The multiplication herein results in a subtraction in phase domain. The multiplication of the two sinusoidal wave results in output signal with two components containing both a summation and a subtraction term of the phases of the two signals, as shown in the equation below.

$$BB(t) = RF(t) \cdot LO(t) \quad (2)$$
$$= A\cos(\omega_{LO}t + \phi_{RF}(t)) \cdot \sin(\omega_{LO}t + \phi_{LO})$$
$$= A\sin(\phi_{RF}(t) - \phi_{LO}) + A\sin(2\omega_{LO}t + \phi_{RF}(t) + \phi_{LO})$$
$$\approx A \cdot (\phi_{RF}(t) - \phi_{LO})$$

In the equation, A represents the amplitude of the BB signal, and $\phi_{RF}$ and $\phi_{LO}$ represent the phase information of the RF and the LO signal, respectively. Typically, due to the limited bandwidth of the analogue circuits (the circuits located before the quantizer, i.e. the mixer), the subtraction term is the only remaining component at the output of the mixer 3. In case both terms are present at the output of the mixer, a baseband low-pass filter (also not shown in the figure) may be used to filter out the summation term of the extracted baseband signal. The mixer thus extracts a BB signal with an amplitude $A_{BB}=A.\Delta\phi$ defined by the gain of the mixer A and the phase misalignment between the two signals $\Delta\phi=(\phi_{RF}-\phi_{LO})$ and a phase $\phi_{BB}$ varying between +Δφ and −Δφ.

Figure 4A:
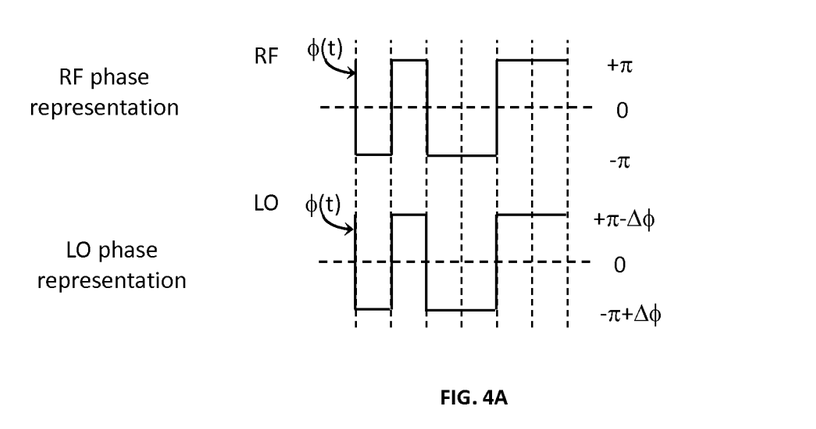
FIG. 4A illustrates an example of the phase information $\phi(t)$ of a local oscillator LO signal synchronized with a radio frequency RF signal.
Figure 4B:
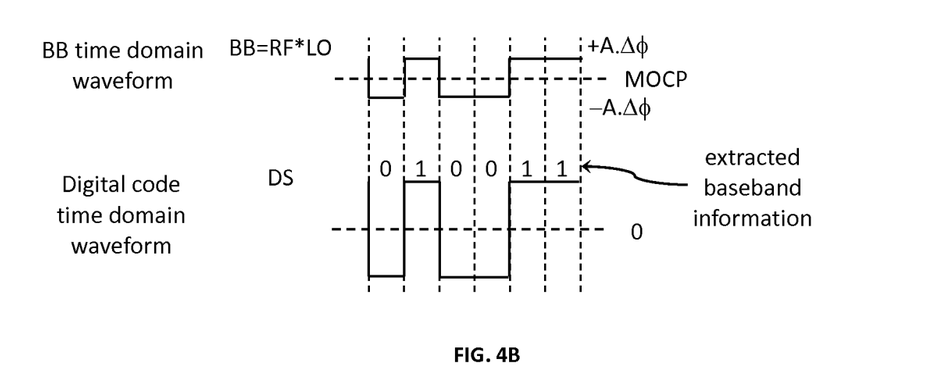
FIG. 4B illustrates an example of the phase information $\phi(t)$ of a resulting baseband BB signal and a digital signal DS when a local oscillator LO signal is synchronized with a radio frequency RF signal.

If both signals are synched having a phase difference Δφ of zero (or negligible) then the extracted baseband BB signal is also in sync with them. Thus, the BB signal is characterized with the same digital pattern as the modulated RF signal. FIG. 4A shows the phase representation of the modulated RF signal and the local oscillator signal LO when both signals are in sync. FIG. 4B, shows the respective time-domain waveform of the extracted BB signal and the digital signal DS. The extracted BB signal has a phase in sync with the RF and LO signals and an amplitude varying between +A.Δφ and −A.Δφ centred around the mixer centre operation point MCOP. As the phase misalignment between the LO signal and the RF signal is minimal (negligible) Δφ≈0, the amplitude of the BB signal $A_{BB}$ is mainly determined by the gain of the mixer A. Thus, the extracted digital signal DS at the output of the system 10 corresponds to the digital information held in the RF signal, i.e. 010011.

As described above, the mixer 3 operates as a phase detector. It down-converts the incoming PSK-modulated RF signal to a baseband BB signal by multiplying it with a local oscillator LO signal generated by a signal generator 6. Mathematically, this is expressed as in Equation (2) above, considering a $\omega_{RF}=\omega_{LO}$. It is clear that the amplitude of the baseband signal is representative of that phase difference of the signals at the input of the mixer. In the case of perfectly synchronized RF and LO signal, the BB signal will have an amplitude of $A_{BB}$ "almost" zero, defined mainly by the gain of the mixer 3 and a phase aligned with the phase of the RF signal.

The synchronization between the LO signal and the RF signal herein is achieved by controlling the phase of the LO signal in accordance to the digitized baseband signal, i.e. digital signal DS. The DS signal is used as a control signal for the signal generator 6. The signal generator 6 generates, based on the digital signal DS, the local oscillator LO signal such that the LO signal is synchronized with the radio frequency RF signal. A feedback loop is thus realized, where the signal generator is used as the feedback element to track the input RF signal's phase or frequency by adjusting the phase of the LO signal, based on the value of the digital signal DS.

To achieve correct demodulation of the RF signal, it is useful to have the synchronization between the LO signal and the RF signal to be as good as possible. Respectively, it is useful to have the phase misalignment between the two signals be as small as possible. Best results are achieved when the phase difference is less than approximately 5 degrees.

The baseband BB signal is then digitized by the quantizer 4 to produce a digital signal DS which may be further processed by a digital baseband block. The digitized baseband signal DS is also fed back to the signal generator 6 to control its operation. The signal generator 6 acts as a feedback element and tracks the input RF signal's phase by adjusting, based on the value of the digital signal DS, the phase of the generated LO signal. The feedback loop, thus, provides a "virtual short" between input RF phase and LO phase and allows the converter to directly track the phase or frequency information of the RF signal by aligning (matching) the phase of the generated LO signal with the phase of the RF signal, as shown in FIG. 1. This way, the phase of the LO signal is brought in sync with the phase of the RF signal. The phase of the RF signal and of the LO signal are the same, as shown in FIG. 4A, along the x-axis their phases are in sync. Similarly, as shown in FIG. 4B, the BB signal is in sync with the phase of RF and LO signals and centred at the mixer's centre operation point MCOP. The amplitude of the BB signal is mainly defined by the gain of the mixer 3.

The converter 2 is, thus, implemented in a closed-loop fashion realizing a direct RF signal tracking loop. This implementation allows to track the RF phase continuously within the complete range between −π to +π.

Figure 2:
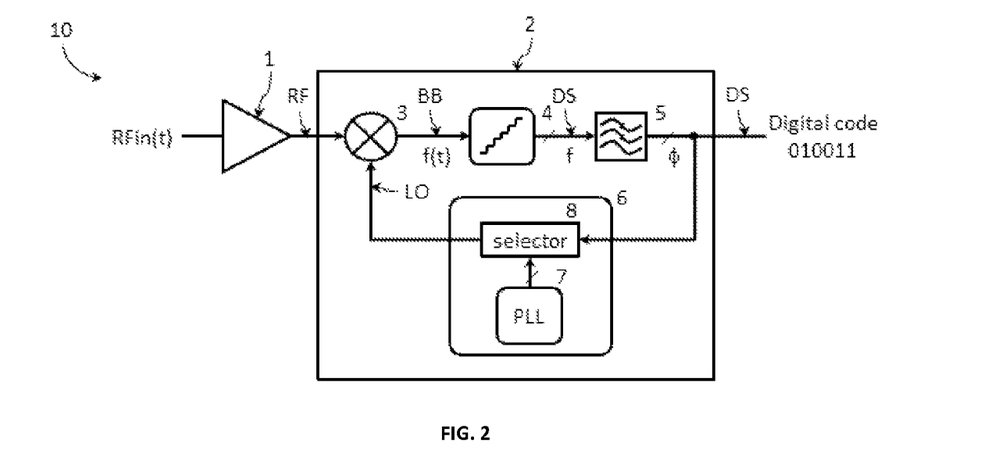
FIG. 2 illustrates, according to another exemplary embodiment, a front-end system of a radio device.
Figure 5:
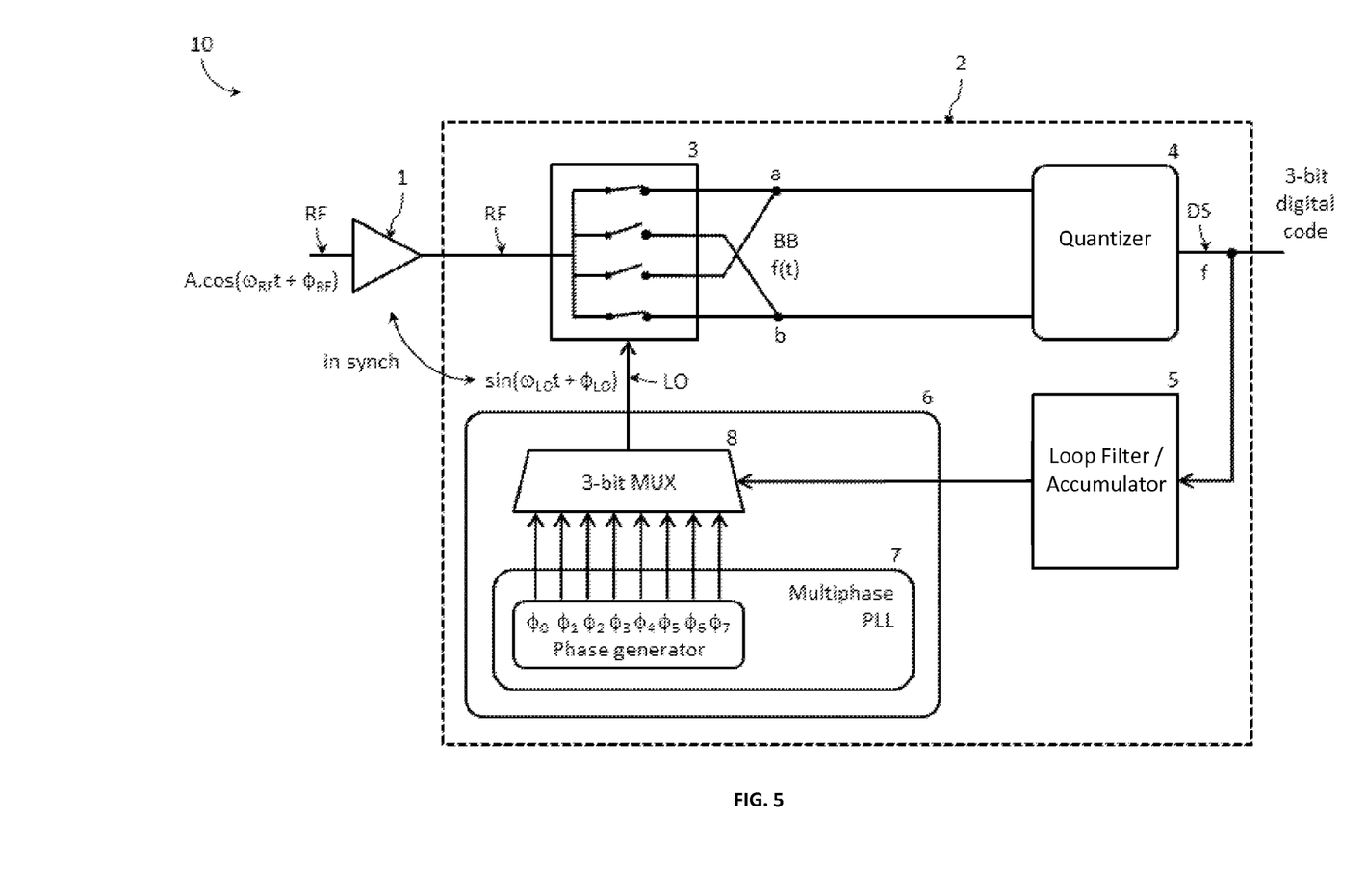
FIG. 5 illustrates, according to another exemplary embodiment, a front-end system of a radio device.

In other embodiments, the signal generator 6 comprises a phase-looked loop (PLL) 7, arranged for generating a plurality of LO signals each having a different phase, as shown in FIG. 2. The PLL is locked to a stable reference signal to generate a stable LO signal with frequency equal to the carrier frequency $\omega_{LO}$. The reference signal may be generated by an internal or an external oscillator. The stable LO signal is then delayed (phase shifted) by the PLL 7 to generate multiple phase shifted versions of the LO signal. A phase generator may be used to generate multiple phase shifted versions of the LO signal. If an analogue PLL 7 is used, the phase generator can be implemented as a divider or a ring oscillator for example. Eight different phases with a discrete phase step of 45 degrees—0°, 45°, 90°, 135°, 180°, 225°, 270° and 315°—can be generated with a frequency divider by 4 (in case of a differential LO signal) or with a ring oscillator with 8 delay elements. If a digital PLL 7 is used, the phase generator can be implemented as a time-to-digital converter. As the skilled person will recognize the circuitry generating the different phase shifted version of the LO signal, i.e. the phase generator, may be part of the PLL circuitry itself or external to it. In the first case the PLL 7 is referred as a multi-phase PLL, as shown in FIG. 5, and in the latter as a single PLL.

In another embodiment, the digital signal DS at the output of the quantizer 4 is feedback to the signal generator 6 to control its operation. The signal generator 6, thus, further comprises a selector 8 arranged for receiving the plurality of LO signals and selecting, based on the value of the digital signal, an LO signal with a phase closest to the phase of the RF signal. The selected LO signal is fed to the mixer 3 for demodulating the RF signal. The selector 8 may be implemented as a multiplexer. Advantageously, the selection of the LO signal (i.e. the tracking and demodulation of RF signal) is kept separate from the generation of the LO signals. The phase tracking and demodulation is performed by simply selecting one of generated LO signals. Further, as the generation of the LO signals is independent from the demodulation process, generating them by a PLL assures the LO signals are also very stable. Additionally, the PLL can be maintained locked during the phase tracking and demodulation, which guarantees stability of the frequency of the LO signal during the demodulation.

In another embodiment, the converter 2 may comprise a loop filter 5 for filtering the quantization noise introduced in the baseband BB signal by the discrete LO phase steps (finite number of LO phases). As the phase shift of the LO signal is modified using a discrete phase shift steps (a predetermined amount of phase shift), the BB signal is distorted by a quantization noise defined by the amount of phase shift step; the bigger the phase step size the higher the quantization noise. To filter this noise, a loop filter 5 (e.g., an analogue integrator or a digital accumulator) may be used, as shown in FIG. 1 and FIG. 2. Advantageously, filtering the quantization noise allows use of a bigger phase shift step and hence less complex circuitry to generate the phase shifts. For example, the resolution requirement for both the signal generator 6 and ADC 4 may be reduced. For a signal generator with 3-bit resolution, $2^3$ different phases of the LO signal are sufficient for the phase tracking of the input RF signal and, hence, the phase shift step can be relaxed to 45 degrees. Practically, four LO signals with phase offset of 90 degrees may be sufficient.

Using a feedback loop (defined by circuits 3, 4, 5 and 6) as according to the present disclosure, the phase detection range of the mixer is improved from around +/−π/8 to full range of +−π. Consequently, this allows use of a Gilbert-cell mixer as a phase detector. If the output phase information is not feedback to perform a synchronization loop, the architecture might experience limitation on the detection range due to the quantization noise introduced by the quantizer 4 and/or the discrete LO phase steps.

Figure 6:
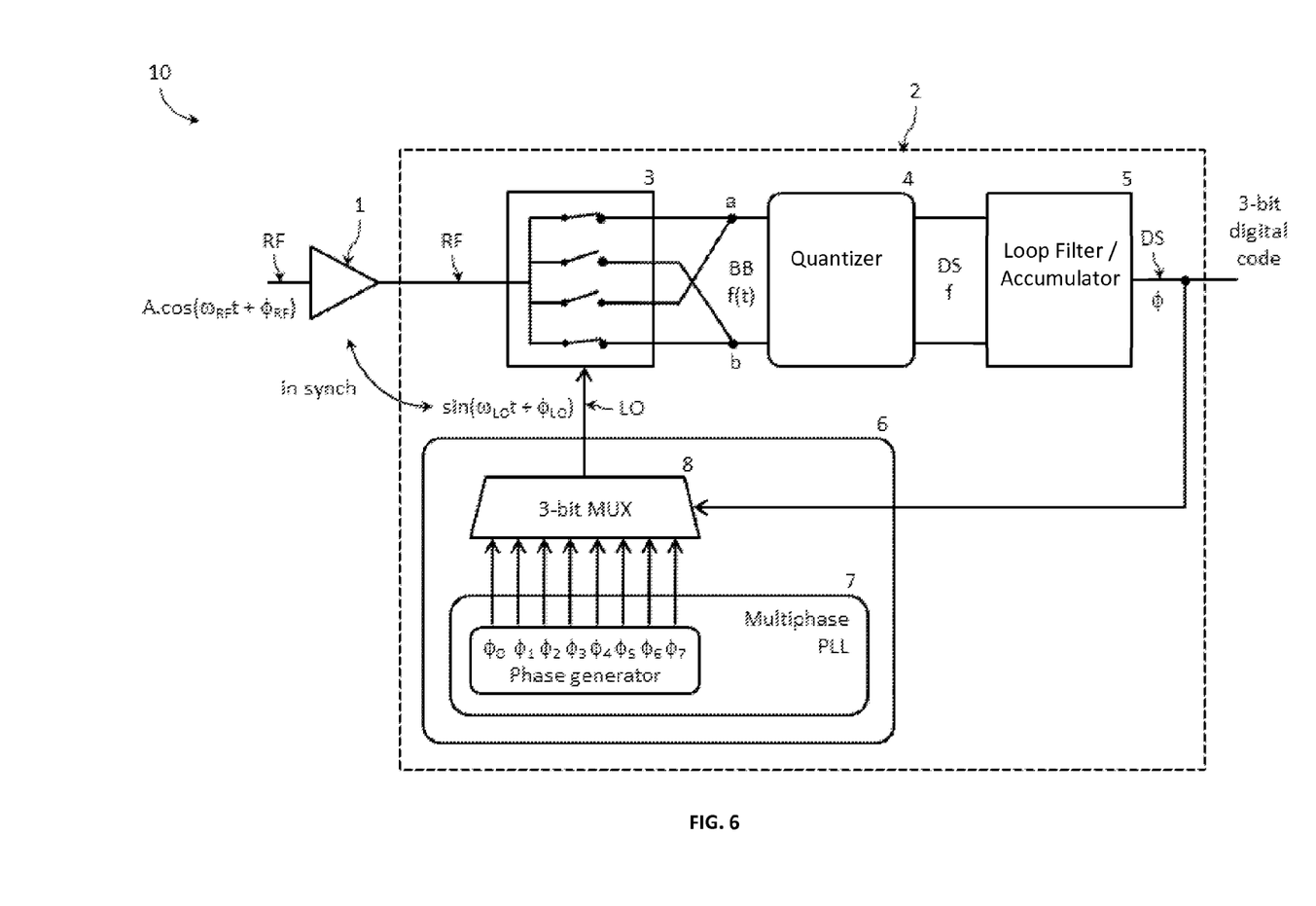
FIG. 6 illustrates, according to another exemplary embodiment, the front-end system shown in FIG. 2.

In further embodiments, the loop filter 5 may be implemented as a digital accumulator for accumulating the digital signal DS before being used as input for the selector 8. For example, the digital signal DS is, first, accumulated by the accumulator 5 and, then, used as a control signal for the selector 8. Depending on the accumulator 5 location in the converter circuitry 2, the front-end system 10 may function as a direct phase or a direct frequency demodulation receiver. For example, for a direct frequency demodulation receiver, the accumulator 5 may be located in the feedback path (defined by the signal generator 6), as shown in FIG. 5. In this case, accumulation happens in the feedback path, not in the signal path. Thus, the digital signal at the output of the quantizer 4, which is fed for further digital baseband processing, is equivalent to the frequency information f. For a direct phase demodulation receiver, the accumulator 5 may be located in the signal path (defined by the mixer 3 and quantizer 4), as shown in FIG. 6. Accumulation happens in the signal path, and hence, the output of the accumulator, i.e. an accumulated DS signal, is equivalent to the phase information φ of the input RF signal. An accumulator of 1/s is sufficient to suppress the phase quantization noise.

Additionally, the loop filter 5 may be implemented as a digital accumulator, as the phase wrap—the continuous phase change within the range of +π to −π—can be easily processed in digital domain without additional cost to the system. The chip area and power consumption of the multi-bit digital accumulators are almost "free" in comparison to an analogue integrator, especially in the deep-submicron CMOS technology. For example, a 12-bit accumulator with 90-nm CMOS devices sampled at 25 MHz consumes less than 10 μW power. Furthermore, as digital accumulators do not rely on voltage headroom, this architecture is also suitable for low-voltage operation.

The power consumption of the proposed direct demodulation receiver simulated in Cadence is shown in Table 1. It is also compared with the conventional zero-IF quadrature receiver. The total power consumption of the direct RF demodulation receiver according to the present disclosure is estimated to be around 1.4 mA, whereas the power consumption of a conventional quadrature receiver is 2.2 mA. Because of the 1-dimensional RF signal processing, the proposed architecture saves almost 40% of total power consumption.

TABLE 1

|  | Proposed RF Direct Demodulation Receiver | Zero-IF quadrature Receiver (Conventional) |
| --- | --- | --- |
| LNA | 400 uA | 400 uA |
| Mixer | 300 uA | 600 uA |
| Analogue baseband (LPF & PGA) | 75 uA | 250 uA |
| DC offset cancellation | 0 | 50 uA |

TABLE 1-continued

|  | Proposed RF Direct Demodulation Receiver | Zero-IF quadrature Receiver (Conventional) |
|---|---|---|
| Quantizer | 25 uA | 100 uA |
| LO multi-phase generation | 300 uA | 200 uA |
| LO buffer for mixer | 300 uA | 600 uA |
| Total RX power consumption | 1.4 mA | 2.2 mA |

Figure 7:
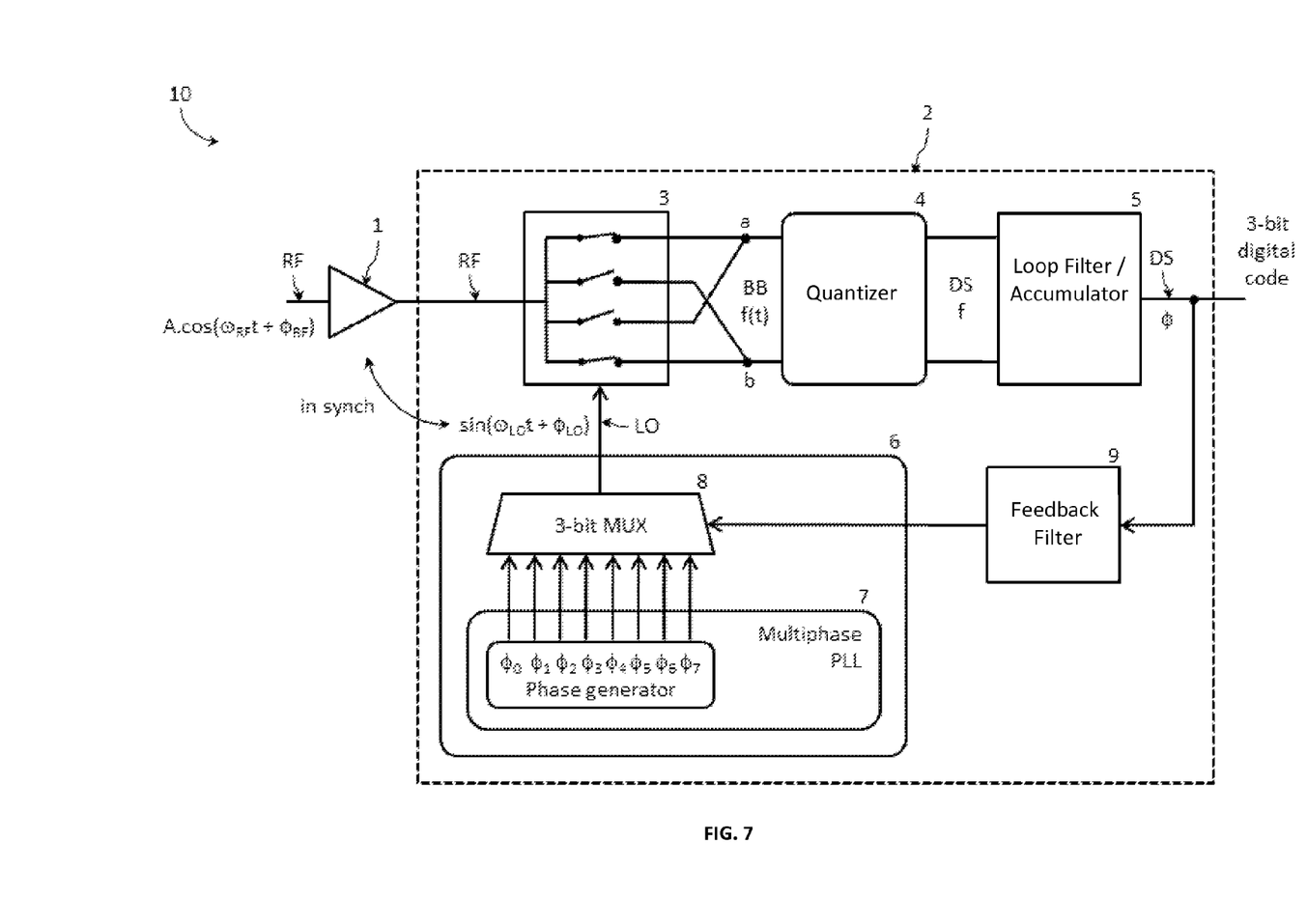
FIG. 7 illustrates, according to another exemplary embodiment, the front-end system of a radio device.

In another embodiment, the proposed front-end system 10 further comprises a filter 9 in the feedback loop, as shown in FIG. 7. If the loop filter (accumulator) 5 is placed in the feedback path as in FIG. 5, the filter 9 is located between the phase selector 8 and the accumulator 5.

The feedback filter 9 aids in improving the robustness of the front-end system 10 to interferences. Robust interference rejection is required e.g. HS-OQPSK in ZigBee or GFSK in Bluetooth Low Energy standards. GFSK and e.g., FSK, GMSK, MSK, HS-OQPSK, PSK modulation causes creation of wide side lobes in the RF signal with frequency spectrum extending over the frequency channel of other users. To avoid this, the BT-LE standard requires RF receivers to be able to sufficiently reject interferences located at 2-3 MHz away from the carrier frequency.

Figure 8:
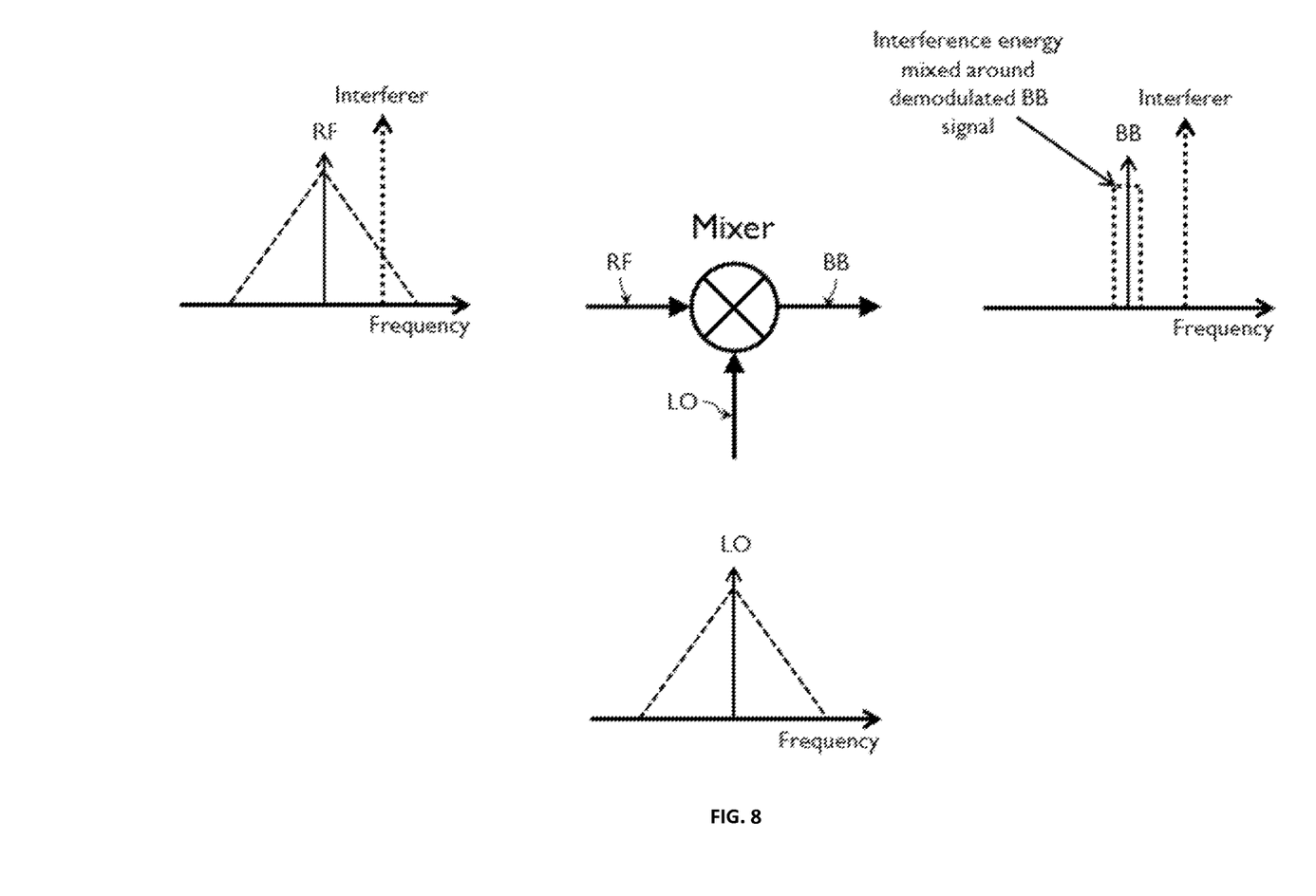
FIG. 8 illustrates the problem of the interference rejection.

In conventional receivers, the demodulation of the RF signal with an LO signal being a sinusoidal tone is equivalent to shifting the frequency spectrum of the RF signal from RF frequency to baseband frequency. As a result, interference rejection can be performed by low-pass filtering or by digital processing of the baseband signal, or a combination of both. In the proposed front-end system 10 demodulation, however, is achieved by tracking the received RF signal with an LO signal being a near perfect copy of the received RF signal. The LO signal, as the RF signal, will be also characterized with wide side lobes extending into neighbouring frequency channels. If an interferer is present within these side lobes, during demodulation the interferer power will be folded back on top of the desired signal, as shown in FIG. 8. The interference resilience is lowered and cannot be compensated, as in conventional architectures simply by low-pass filtering and/or by digital processing of the baseband signal.

Figure 9:
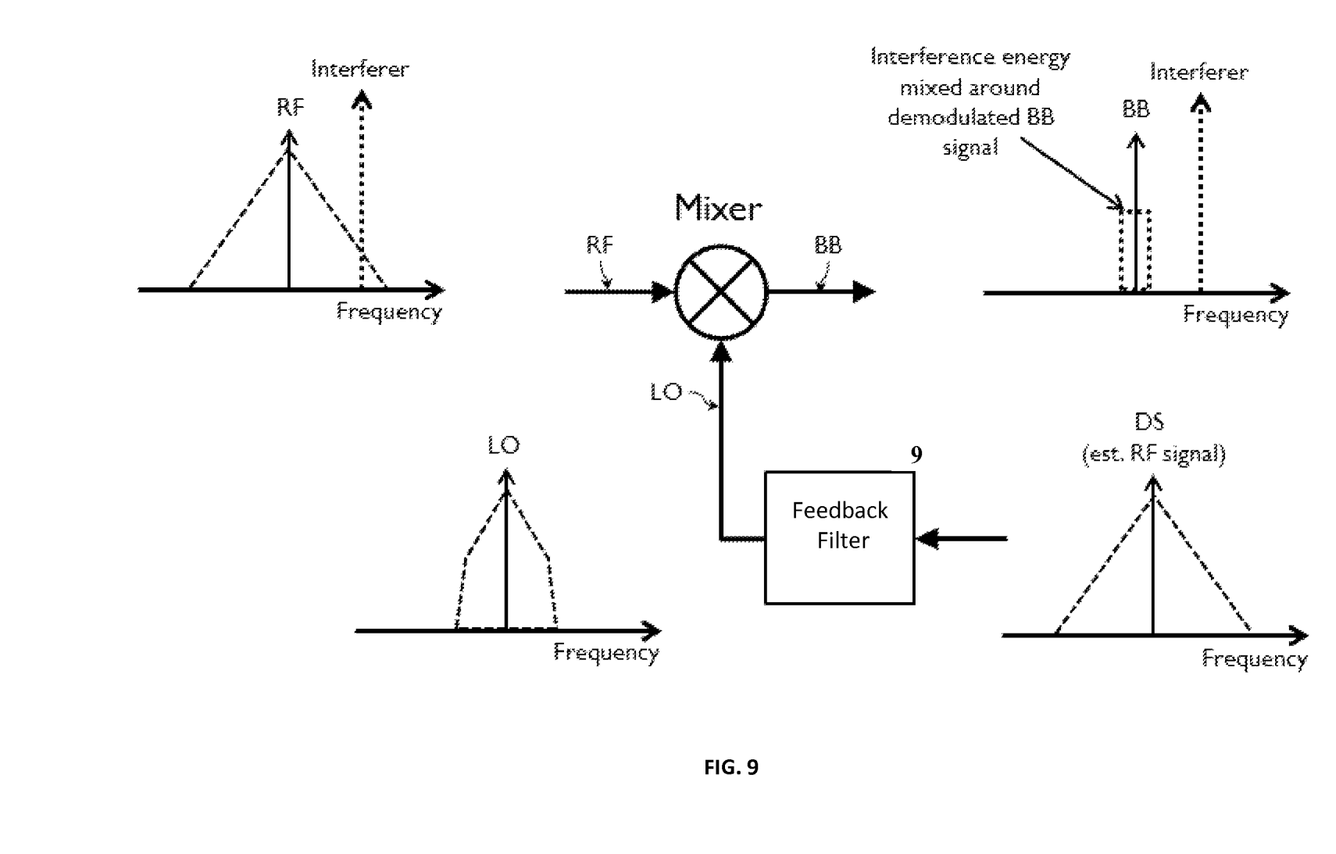
FIG. 9 illustrates the effect of the feedback filter on improving the interference rejection.

Improving the interference rejection, herein, is achieved with the feedback filter 9 located in the feedback path. The filter 9 aims at filtering the digital signal DS to make the copy of the received RF signal at the output of the selector 8 slightly less perfect. The filter 9 thus narrows the spectrum of the side lobes of the LO signal such that less interferer power ends up at baseband frequency after the demodulation operation, as shown in FIG. 9. As shown in the figure, less interference energy is mixed around demodulated BB signal. The feedback filter 9 is a low-pass filter that effectively narrows the frequency spectrum of the LO signal by filtering high frequency components in the estimated RF signal (i.e. the digital signal DS). Thus, if an interferer is located outside the filtered frequency spectrum of the LO signal, it will not be demodulated to baseband frequency.

The purpose of feedback filter 9 is different from the loop filter 5. The loop filter 5 is designed to track the received RF signal with an LO signal being an as accurate as possible copy of the RF signal. The purpose of the feedback filter 9, however, is to make the tracking slightly less accurate.

Making the LO signal less ideal comes at a cost of lowered interference performance at 0 and 1 MHz distance. However, at 0 and 1 MHz distance the proposed front-end system allows for this loss in interference performance as it offers ample headroom over the required by BT-LE of approximately 12 dB headroom compared to BT-LE standard, as shown in Table 2. By employing a feedback filter, the interference performance (ICR, dB) at 0 and 1 MHz is lowered from −9 dB and −4 dB to −11 dB and −6 dB, while at 2 MHz and 3 MHz is increased from 20 dB and 30 dB to 22 dB and 33 dB. The headroom at 2 MHz and 3 MHz is thus increased from 3 dB to 6 dB, which is in compliance with the standard requirements and comparable with current state-of-the-art solutions (e.g. ER-PAN, NORIDC nRF8001 and TI CC2451).

TABLE 2

|  | front-end system 10 (simulated) | ER-PAN | NORIDC nRF8001 | TI CC2451 | BT-LE standard |
|---|---|---|---|---|---|
| Data rate | 1 Mbps | 1 Mbps | 1 Mbps | 1 Mbps | 1 Mbps |
| Modulation | GFSK | GFSK | GFSK | GFSK | GFSK |
| Power, mW | <2 | 3.8 | 37.5 | 53.7 | — |
| Sensitivity, dBm | −97 | −98 | −87 | −94 | −70 |
| ICR, dB at 0/1/2/3 Mhz | −9/−4/20/30 w/o filter 9 and −11/−6/22/33 with filter 9 | −5/3/25/35 | −13/−7/23/51 | −6/−2/26/34 | −21/−15/17/27 |
| CFO | +/−100 ppm | — | +/−100 ppm | +/−100 ppm | +/−62.5 ppm (TX only) |
| CF drift, kHz | >50 | — | >50 | >50 | ≤50 |

The filter 9 could be also placed after the phase selector 8. The location of the filter defines its implementation and operational frequency. If placed before the selector 8, the filter is implemented as a digital filter operating at baseband frequency, or if placed after the selector 8, as analogue filter operating at RF frequency. A digital filter can be implemented very efficiently as a simple, small, low cost and very low power digital filter implementation is sufficient to realize an equivalent quality factor at RF (e.g. 1000) as the filter needs to filter a low frequency digital signal (e.g. 3-bit code word). For example, a digital filter implementing a first-order Butterworth filter can be used. Other type and/or order of the filter can also be used, as long as the filter is designed for a low latency for the desired signal feedback and sufficiently suppresses of side lobes of the LO signal to provide the required headroom above the standard requirement, e.g. 6 dB or higher. However, when placed in analogue domain, after the selector 8, implementing an analogue filter with the required quality factor and operating at RF frequency makes such filter power hungry and impractical for implementing in modern CMOS technology.

Figure 10:
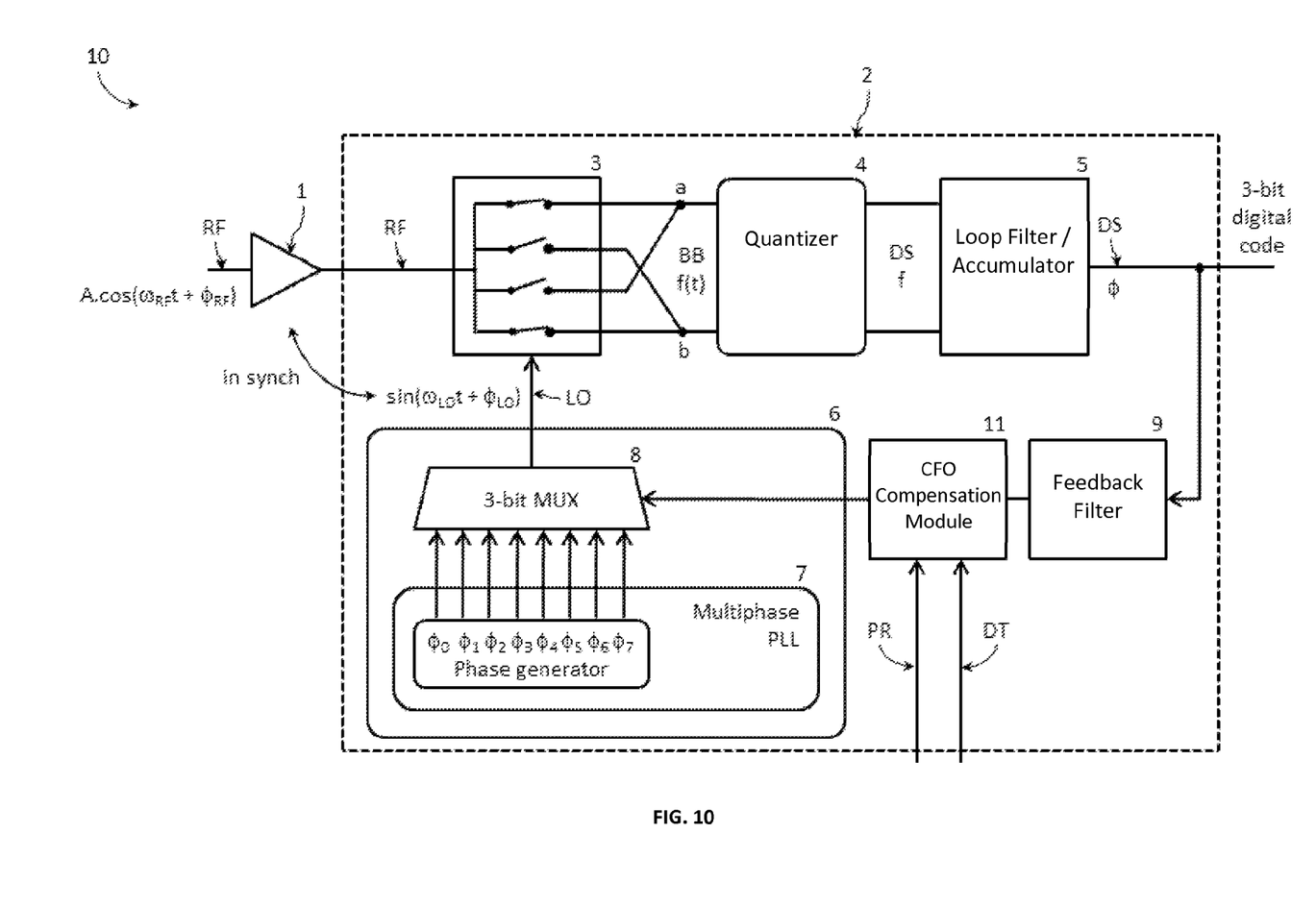
FIG. 10 illustrates, according to another exemplary embodiment, the front-end system of a radio device.

In another embodiment, the front-end system 10 further comprises a carrier frequency offset (CFO) compensation to assure the front-end system can operate correctly over a wide CFO range and track carrier drift during data reception as shown in FIG. 10. The front-end system is able to track the frequency or phase changes as the system 10 is trying to lock itself to the phase of the RF signal. After demodulating and then low-pass filtering the received RF signal into a digital signal DS, the DS signal holds the amount of a residue error. By integrating, in the loop filter 5, this instantaneous residue error is translated into a phase error. The phase error is then fed back through the feedback loop into the phase selector 8 to update the output signal generator 6 to more closely match the actual phase of the incoming RF signal—the phase of the LO signal is selected according to the phase error so that LO signal matches the RF signal as closely as possible. Thus based on the instantaneous phase error the instantaneous phase of the LO signal used to demodulate the incoming RF signal is increased or decreased. This procedure is comparable to a phase-locked-loop (PLL). However, an important difference is that a PLL commonly locks to a sinusoidal source (e.g. a crystal), where the proposed front-end system 10 is locking to a modulated RF carrier containing information bits. If carrier frequency offset (CFO) occurs between output of the signal generator 6 and the incoming RF signal this results in additional phase changes. Effectively the phase of the demodulated signal appears to rotate faster in one direction and slower in the other. Due to the innate ability of the front-end system 10 to phase lock to the incoming signal, it can withstand some CFO, up to +/−10 ppm. However, offsets above this number will create phase errors so large that the system 10 cannot lock to the incoming RF signal and cannot correctly receive the data. Exacerbating the situation is the specification in BT-LE which allows the RF signal to drift up to 20 ppm during a packet. As the front-end system 10 is a feedback system tracking the RF signal directly and providing the demodulated data at the output, any such drift will cause the front-end system 10 to become unlocked. Because the front-end system 10 has only one branch, losing the phase lock will result in losing the data. Post processing the demodulated data at baseband to correct for any CFO may not be possible. The CFO thus may need to be compensated immediately so the system 10 can lock. The CFO may be compensated directly in the loop so that the system is properly locked, otherwise any received data may be lost.

FIG. 10 shows the proposed front-end system 10 including a CFO compensation module 11 embedded in the feedback loop, before the phase selector 8 and after the feedback filter 9. All CFO compensations are thus performed in digital domain (the digital signal DS being representative of the phase error between the received RF and the LO signal is compensated for any CFO). A digital CFO compensation is thus performed in the phase domain in the feedback path to allow the system 10 to lock over a wider CFO range and be able to track carrier drift during data reception (during payload data reception). The CFO compensation 11 corrects the digital signal DS (i.e. the instantaneous phase error) for any CFO before being used as input from the phase selector 8. Advantageously, this CFO compensation 11 allows for the correction to start after detection of the next sample.

Figure 11:
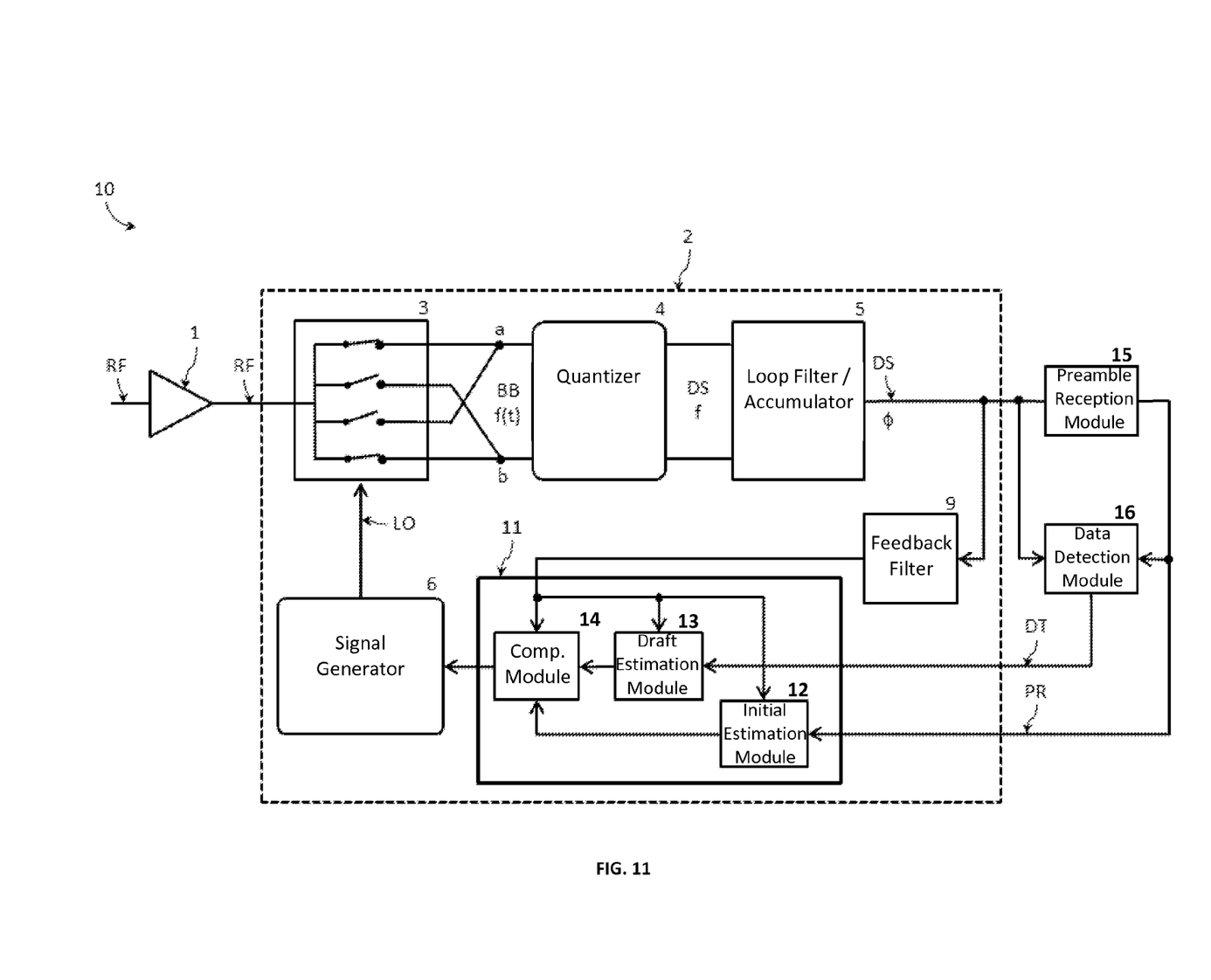
FIG. 11 illustrates in more details the front-end system of a radio device of FIG. 10.

The operation of the CFO compensation 11 will now be explained with reference to FIG. 11. The CFO compensation module 11 comprises an initial CFO estimation module 12, a CFO drift estimation module 13 and a compensation module 14. As their names suggest, module 12 is responsible for estimation of the amount of the initial CFO at preamble reception, module 13 for the estimation of the amount of the CFO drift during data (payload) reception, and module 14 for the compensation of both initial CFO and CFO drift. The output of modules 12 and 13 are fed to the compensation module 14 where firstly the initial CFO is compensated followed by the compensation of the CFO drift.

Module 15 indicates detection of the preamble reception by sending detection signal PR to the initial CFO estimation module 12. On reception of the detection signal PR, module 12 compares the accumulated phase during a portion of the preamble period outputted by the loop filter 5 with a known ideal value of the accumulated phase during a similar portion of the preamble period. The known value can be derived from the definition of the preamble from, e.g., the BT-LE standard. The result of the comparison is indicative of the amount of the initial CFO correction factor in phase domain needed per digital sample in the feedback loop. This amount is then fed into the compensation module 14 which appropriately counter rotates the phase of the digital signal. The output of the compensation module 14 is thus the digital signal DS corrected for initial CFO.

The preamble detection signal PR is also an input to the data detection module 16. The data detection module 16 and the data aided CFO compensation module 13 are activated in the loop after the preamble is detected. Module 16 decides which information bits are actually received during data (packet) reception based upon the digital output of loop filter 5 and based upon the timing of the preamble detection peak. Module 13 calculates the expected accumulated phase for a non-CFO case based upon the information bit decisions of module 16. Simultaneously, module 13 compares the calculated expected accumulated phase to the output of feedback filter 9, where the output of feedback filter 9 is the actually accumulated phase in the loop during data reception. During data (packet) reception, the CFO compensation factor in module 14 is updated at every digital sample based upon the phase comparison in module 13, thereby correcting CFO drift in the feedback loop immediately. Via this approach an initial CFO estimation error will also be corrected during data reception. Moreover, the continual updating of the CFO compensation factor in module 14 prevents the loop from losing the phase lock to the desired signal due to either CFO drift, and or a residual CFO error.

The CFO compensation module 11 allows the front-end system 10, during preamble reception, to cope with initial CFO error of +/−100 ppm, and, during data reception with CFO drift of +/−40 ppm if the accumulated CFO does not exceed +/−100 ppm.

Advantageously, the proposed front-end architecture can directly demodulate frequency or phase information with only 60%-70% power consumption of the conventional quadrature front-end circuit as both the RF and analogue hardware complexity can be reduced. The requirements on IQ mismatches are avoided as the receiver operates on the phase or frequency information of the RF signal and not on an I and Q demodulated signal. The receiver is suitable for low-voltage operation as the RF signal is in phase or frequency domain, instead of in voltage domain as in quadrature receiver. Additionally, the system 10 has a relaxed dynamic requirement of the analogue circuits, as most of the baseband processing can be performed in digital domain. For example FIG. 5 and FIG. 6 show the quantizer 4, the loop filter 5, and the signal generator 6 operating in the digital domain, and FIG. 9 to FIG. 11 show the feedback filter 9, the CFO compensation module 11, the preamble detection 15, and data detection 16 operating in the digital domain. It is suitable for future CMOS technology scaling, and hence the advantage of digital signal processing power can be fully utilize. In addition, the circuitries operating in digital domain may be implemented in software instead. For example, a micro-processor running stored software may be used to accomplish the functionality of the digital circuitries.

In a further embodiment, the present disclosure relates to a radio device comprising a front-end system 10 of the present disclosure. The present disclosure further relates to a communication network comprising at least one such radio device.

What is claimed is:

1. A front-end system for a radio device comprising:
a converter, the converter comprising:
a signal generator configured to generate a local oscillator signal,
a mixer configured for down-converting a modulated radio frequency signal into a baseband signal by using the local oscillator signal generated by the signal generator, and
a quantizer arranged for quantizing the baseband signal into a digital signal comprising a sequence of discrete values, wherein the digital signal is representative of a phase of the modulated radio frequency signal,
wherein the signal generator is configured for continuously adjusting, based on the discrete values of the digital signal, a phase of the local oscillator signal such that the phase of the local oscillator signal is synchronized with the phase of the modulated radio frequency signal and the baseband signal is characterized with a same digital pattern as the modulated radio frequency signal, and
wherein the converter directly extracts digital information carried in the modulated radio frequency signal as the baseband signal, and
wherein the converter comprises only a single radio-frequency-to-analogue signal processing path.

2. The front-end system for a radio device as in claim 1, wherein the signal generator comprises a phase-locked loop arranged for generating a plurality of signals each having a different phase.

3. The front-end system for a radio device as in claim 2, wherein the signal generator further comprises a selector arranged for selecting, based on the discrete values of the digital signal, a signal from the plurality of signals and for providing the selected signal to the mixer.

4. The front-end system for a radio device as in claim 3, wherein the selected signal is selected such that the difference in phase between the selected signal and the modulated radio frequency signal is minimal.

5. The front-end system for a radio device as in claim 3, further comprising an accumulator arranged for accumulating the digital signal before being used as input for the selector.

6. The front-end system for a radio device as in claim 2, wherein the phase-locked loop comprises a phase generator arranged for generating a plurality of phase shifts and adding the plurality of phase shifts to a reference signal, thereby generating the plurality of signals each having a different phase.

7. The front-end system for a radio device as in claim 6, wherein the phase generator is further arranged for providing the plurality of signals to a selector arranged for selecting, based on the value of the digital signal, a signal from the plurality of signals and for providing the selected signal to the mixer.

8. The front-end system for a radio device as in claim 1 suitable for constant-envelope modulation schemes.

9. The front-end system for a radio device as in claim 1 suitable for low peak-to-average ratio non-constant envelope modulation schemes.

10. The front-end system for a radio device as in claim 1, further comprising a filter arranged for filtering the digital signal before the signal generator.

11. The front-end system for a radio device as in claim 1, further comprising a carrier frequency offset (CFO) compensation module arranged for compensating for an initial CFO offset.

12. The front-end system for a radio device as in claim 1, wherein the mixer down-converts the modulated radio frequency signal into the baseband signal without processing a quadrature signal.

13. The front-end system for a radio device as in claim 1, wherein the signal generator is configured for continuously adjusting the phase of the local oscillator signal such that a difference between the phase of the local oscillator signal and the phase of the modulated radio frequency signal is less than five degrees.

14. A radio device comprising a front-end system, the front-end system comprising a converter, wherein the converter comprises:
a signal generator configured to generate a local oscillator signal,
a mixer configured for down-converting a modulated radio frequency signal into a baseband signal by using the local oscillator signal generated by the signal generator, and
a quantizer arranged for quantizing the baseband signal into a digital signal comprising a sequence of discrete values, wherein the digital signal is representative of a phase of the modulated radio frequency signal,
wherein the signal generator is configured for continuously adjusting, based on the discrete values of the digital signal, a phase of the local oscillator signal such that the phase of the local oscillator signal is synchronized with the phase of the modulated radio frequency signal and the baseband signal is characterized with a same digital pattern as the modulated radio frequency signal, and
wherein the converter directly extracts digital information carried in the modulated radio frequency signal as the baseband signal, and
wherein the converter comprises only a single radio-frequency-to-analogue signal processing path.

15. The radio device as in claim 14, wherein the signal generator comprises a phase-locked loop arranged for generating a plurality of signals each having a different phase.

16. The radio device as in claim 15, wherein the phase-locked loop comprises a phase generator arranged for generating a plurality of phase shifts and adding the plurality of phase shifts to a reference signal, thereby generating the plurality of signals each having a different phase.

17. A communication network comprising a radio device, the radio device having a front-end system, wherein the front-end system comprises a converter, and wherein the converter comprises:
a signal generator configured to generate a local oscillator signal,
a mixer configured for down-converting a modulated radio frequency signal into a baseband signal by using the local oscillator signal generated by the signal generator, and
a quantizer arranged for quantizing the baseband signal into a digital signal comprising a sequence of discrete values, wherein the digital signal is representative of a phase of the modulated radio frequency signal,
wherein the signal generator is configured for continuously adjusting, based on the discrete values of the digital signal, a phase of the local oscillator signal such that the phase of the local oscillator signal is synchronized with the phase of the modulated radio frequency signal and the baseband signal is characterized with a same digital pattern as the modulated radio frequency signal, and wherein the converter directly extracts digital information carried in the modulated radio frequency signal as the baseband signal, and wherein the converter comprises only a single radio-frequency-to-analogue signal processing path.

18. The communication network as in claim 17, wherein the signal generator comprises a phase-locked loop arranged for generating a plurality of signals each having a different phase.

19. The communication network as in claim 18, wherein the phase-locked loop comprises a phase generator arranged for generating a plurality of phase shifts and adding the plurality of phase shifts to a reference signal, thereby generating the plurality of signals each having a different phase.

* * * * *